United States Patent
Franzen et al.

(10) Patent No.: US 6,919,529 B2
(45) Date of Patent: Jul. 19, 2005

(54) METHOD OF LASER WELDING A FLEXIBLE CIRCUIT BOARD WITH A METAL CONTACT

(75) Inventors: Frank Franzen, Bad Abbach (DE); Detlef Haupt, Steinsberg (DE); Josef Loibl, Bad Abbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/352,497

(22) Filed: Jan. 28, 2003

(65) Prior Publication Data

US 2003/0114022 A1 Jun. 19, 2003

Related U.S. Application Data

(63) Continuation of application No. PCT/DE01/02638, filed on Jul. 13, 2001.

(30) Foreign Application Priority Data

Jul. 28, 2000 (DE) .......................................... 100 36 900

(51) Int. Cl.[7] .............................................. B23K 26/20
(52) U.S. Cl. .............................................. 219/121.64
(58) Field of Search ....................... 219/121.63, 121.64; 439/876

(56) References Cited

U.S. PATENT DOCUMENTS

| | | | | |
|---|---|---|---|---|
| 5,676,865 A | | 10/1997 | Chang ................... | 219/121.64 |
| 5,829,125 A | * | 11/1998 | Fujimoto et al. ............. | 29/840 |
| 6,394,158 B1 | * | 5/2002 | Momeni ................... | 156/272.8 |
| 6,533,620 B2 | * | 3/2003 | Franzen et al. ............. | 439/876 |
| 6,595,405 B2 | * | 7/2003 | Terunuma et al. ..... | 228/180.21 |

FOREIGN PATENT DOCUMENTS

| | | | |
|---|---|---|---|
| DE | 44 46 289 A1 | 6/1995 | ........... B23K/26/00 |
| DE | 195 04 967 A1 | 8/1996 | ......... H01L/21/603 |
| DE | 196 44 121 A1 | 5/1997 | ........... H01R/43/02 |
| DE | 199 29 179 A1 | 1/2001 | ........... H05K/3/02 |
| EP | 1186370 A2 * | 3/2002 | |
| JP | 11-46426 A * | 2/1999 | |
| WO | WO98/44593 | 10/1998 | ............ H01R/9/07 |
| WO | WO00/49841 | 8/2000 | ............ H05K/3/32 |

* cited by examiner

Primary Examiner—Geoffrey S. Evans
(74) Attorney, Agent, or Firm—Baker Botts L.L.P.

(57) ABSTRACT

A method for producing an electrical circuit between a flexible circuit board (1) is described, with single-sided access and a metallic contact partner (8), such that the contact partner (8) reaches the metallic conductor strip (4) of the circuit board (1) through an access opening (6) in the unit. The circuit board (1) is thus irradiated with laser light (9) in a region opposite the access opening (6) causing a welded connection between the contact partner (8) and the conductor strip (4) to be formed.

9 Claims, 2 Drawing Sheets

METHOD OF LASER WELDING A FLEXIBLE CIRCUIT BOARD WITH A METAL CONTACT

CROSS REFERENCE TO RELATED APPLICATION

This application is a continuation of copending International Application No. PCT/DE01/02638 filed Jul. 13, 2001, which designates the United States, and claims priority to German application number 10036900.6 filed Jul. 28, 2000.

BACKGROUND OF THE INVENTION

The invention relates to a method for producing an electrical connection between a flexible circuit board with single-sided access and a metallic contact partner, to an arrangement of the elements referred to with an electrical connecting point realized between them and to a module for complete installation in an engine or a gearbox of a motor vehicle, which uses such an electrical connecting point.

It is already known to use laser welding methods for realizing an electrically conducting connection between a flexible circuit board and a metallic conductor. Benefits in principle of this technology are that no additional parts, such as rivets for example, are required for creating the connection and that the connections can be fabricated at low cost in production and with great variability in design.

However, for practical applications it is disadvantageous that laser welds can currently only be carried out on circuit boards with access from both sides. In addition, further measures are often required in addition to irradiation with laser light to ensure that a dependable and mechanically stable connection is created. For instance, U.S. Pat. No. 5,676,865 describes a laser welding method in which openings lying opposite one another are first introduced into the insulating layers of the flexible circuit board on the bottom and top sides, so that a conductor strip running in between is exposed on both sides in the regions of the openings. The exposed conductor strip is then provided with a central hole of reduced diameter. The rim of the hole in the conductor strip is subjected to a forming operation, so that it comes into contact with an electrical conductor on which the flexible circuit board is resting with one side. The welding of the conductor strip to the conductor takes place in the formed region of the rim of the hole by means of a laser.

In the case of this method, it is problematical that, on account of the central hole, occasionally there is not adequate conductor strip material available for a dependable and durable welded connection.

To remedy this, German Patent Application DE 199 06 807, which is not a prior publication, proposes a method which makes it possible without mechanical working (for example hole punching or forming operations) of the conductor strip to produce a welded connection between the latter and a contact partner. However, even in the case of this method there must be access to the conductor strip from both sides. A disadvantage of this is that circuit boards with access from both sides are much more expensive than circuit boards of comparable size and type with access from one side. The reason for this is that circuit boards with access from one side can be produced from continuous material in a low-cost process known as a reel-to-reel process, while circuit boards with access from both sides have to be produced from individual sections of material (on account of the high requirements for the alignment accuracy with respect to the access openings lying opposite one another).

SUMMARY OF THE INVENTION

The invention is based on the object of providing a method for producing an electrical connection between a flexible circuit board and a metallic contact partner which can be carried out easily and at low cost and at the same time realizes a mechanically stable and electrically dependable connection. In particular, it is intended for the connecting point created by means of the method also be suitable for contacting electrical components under aggravated ambient conditions, as prevail, for example, in a gearbox or an engine of a motor vehicle.

This object can be achieved by a method for producing an electrical connection between a flexible circuit board with single-sided access and a metallic contact partner, comprising the steps of:

providing the flexible circuit board, comprising two insulating layers and at least one metallic conductor strip running in between, wherein in the first insulating layer of which there is formed an access opening exposing the conductor strip;

bringing the metallic contact partner and the circuit board toward each other in such a way that the metallic contact partner is brought to bear against the metallic conductor strip through the access opening; and irradiating the second insulating layer with laser light at a location lying opposite the access opening, wherein a welded connection being formed between the contact partner and the conductor strip.

The welding operation can be carried out in such a way that the occurrence of an annular welding region between the conductor strip and the contact partner is avoided to the greatest extent or completely. The welding operation can also be carried out in such a way that a melting depth of the surface of the contact partner of between 0.5 and 1 mm is obtained by the laser light irradiation. An Nd:YAD laser can be used as the laser light source and is operated at an average power in the range from 30 to 500 W. A light spot with a diameter of between 0.3 and 0.6 mm can be produced on the second insulating layer by means of an optical system lying in the beam of the laser. A welding energy of from 7 to 11 J can be applied during a welding period of from 3 to 10 ms. A pulsed Nd:YAG laser with a pulse power of 1 to 3 kW can be used. A number of laser light pulses applied to the second insulating layer in a positionally offset manner can be used for creating the welded connection. The contact partner can have a silvered bearing surface.

An arrangement according to the present invention may comprise a flexible circuit board with single-sided access, a metallic contact partner and an electrical connecting point between the flexible circuit board and the metallic contact partner, in which the flexible circuit board is constructed from two insulating layers and at least one metallic conductor strip running in between, an access opening is formed in a first insulating layer, the metallic contact partner protrudes through the access opening and is welded there to the metallic conductor strip, and a fire damage region, brought about by the laser light irradiation used for the welding, is present in the second insulating layer, lying opposite the access opening.

The welding operation can be carried out in such a way that the occurrence of an annular welding region between the metallic conductor strip and the metallic contact partner is avoided to the greatest extent or is completely avoided. The welding operation can be carried out in such a way that a melting depth of the surface of the contact partner of between 0.5 and 1 mm is obtained by the laser light irradiation. A light spot with a diameter of between 0.3 and 0.6 mm can be produced on the second insulating layer by means of an optical system lying in the beam of the laser. A number of laser light pulses applied to the second insulating layer in a positionally offset manner can be used for creating the welded connection. The contact partner can have a silvered bearing surface.

A module according to the present invention for complete installation in an engine or a gearbox of a motor vehicle, may comprise a control device which has an oiltight housing, in which an electronic circuit is accommodated, a flexible circuit board, which is in electrical connection with the electronic circuit and is led to the outside through a sealing gap in the housing, and which is constructed from two insulating layers and at least one metallic conductor strip running in between, and which comprises an access opening is formed in a first insulating layer, electrical terminals which are provided outside the control device and are connected as a contact partner to the flexible circuit board, wherein the metallic contact partner protrudes through the access opening and is welded there to the metallic conductor strip, and a fire damage region, brought about by the laser light irradiation used for the welding, is present in the second insulating layer, lying opposite the access opening. The electrical terminals can be realized by a metallic leadframe.

A major aspect of the invention is that the method uses a flexible circuit board with access from one side, i.e. it has been found within the scope of the invention that the irradiation with laser light for producing the weld structure can take place directly through the second insulating layer. This dispenses with the need to provide a cutout in the second insulating layer already during the production of the circuit board at the point which is later to be irradiated or to create access subsequently at this point from both sides by local removal of the second insulating layer on the flexible circuit board after its production has been completed.

Investigations carried out within the scope of the invention show that, with customary films of plastic used in circuit board fabrication (for example polyimide film) and when using an Nd:YAG laser (wavelength 1.06 $\mu$m), the laser light penetrates the film of plastic (second insulating layer) with virtually no energy loss and any energy absorption only occurs when the light impinges on the conductor strip, realized in particular as a copper layer. In this case, the energy introduced during the welding leads to virtually instantaneous melting of the conductor strip and penetration of the laser beam into the region where the contact partner comes to bear. The depth of penetration of the laser beam into the contact partner is an important factor for the quality of the connection formed by the welding operation. If the laser beam is not able to penetrate into the contact partner, i.e. if only the conductor strip is melted, a satisfactory welding result is not achieved. If, on the other hand, the laser beam penetrates into the contact partner, an effect which is referred to as a deep-weld effect occurs. This consists in that the material of the contact partner is instantaneously melted and a more or less eruptive behavior of the metal melt is observed. The eruptive behavior leads to melted material of the contact partner splashing away, the material loss in the central region of the contact partner causing a depression to form. As a consequence of the formation of the depression, an annular welded region is obtained, which is undesired because, depending on the size of the ring opening, part of the available welding area remains unused. The method according to the invention is therefore preferably carried out in such a way that a deep-weld effect optimizing the quality of the welded connection is achieved, which means that, although melting of the surface of the contact partner takes place, splashing away of the metal melt is avoided to the greatest extent or completely. In an ideal case, a full-area (circular disk-shaped) welding region is achieved as a result, although an annular welding region with a comparatively small ring opening can also be tolerated.

To achieve a deep-weld effect optimizing the quality of the welded connection, the laser is preferably operated in such a way that the melting depth of the surface of the contact partner is between 0.5 and 1 mm.

The extent to which the deep-weld effect occurs is influenced by a large number of parameters. Advantageous value ranges for the parameters of welding energy, pulse power, welding time and light spot diameter, which lead to welded connections with good mechanical and electrical strength are specified in the subclaims.

A further advantageous measure of the method is characterized in that a number of laser light pulses applied to the second insulating layer in a positionally offset manner are used for creating the welded connection. The positional offset (of the corresponding light spots on the second insulating layer) effectively increases the size of the welding region, which leads to an increase in the strength of the connection.

An important technical application of the arrangement according to the invention with an electrical connecting point is the contacting of electrical wiring elements or the direct contacting of electrical components which are accommodated together with a control device in an engine or gearbox of a motor vehicle. For such mechatronic control systems there has recently been developed a technical concept in which an electronic circuit accommodated in the control device housing is connected to electrical wiring elements by means of a flexible circuit board that is led to the outside through a sealing gap in the housing or directly to terminal pins of sensors and/or actuators located in the gearbox or engine. For this technology, the arrangement according to the invention provides a suitable and low-cost possibility for electrical contacting between the elements referred to, the welded connection provided being surprisingly so resistant that it is able to withstand the ambient conditions prevailing in a gearbox or engine (temperature range from about $-40°$ C. to $150°$ C., vibrations up to about 40 g).

BRIEF DESCRIPTION OF THE DRAWINGS

The invention is explained below on the basis of an exemplary embodiment and configurational variants of the same with reference to the drawing, in which.

DETAILED DESCRIPTION OF THE
PREFERRED EMBODIMENTS

Figure 1:
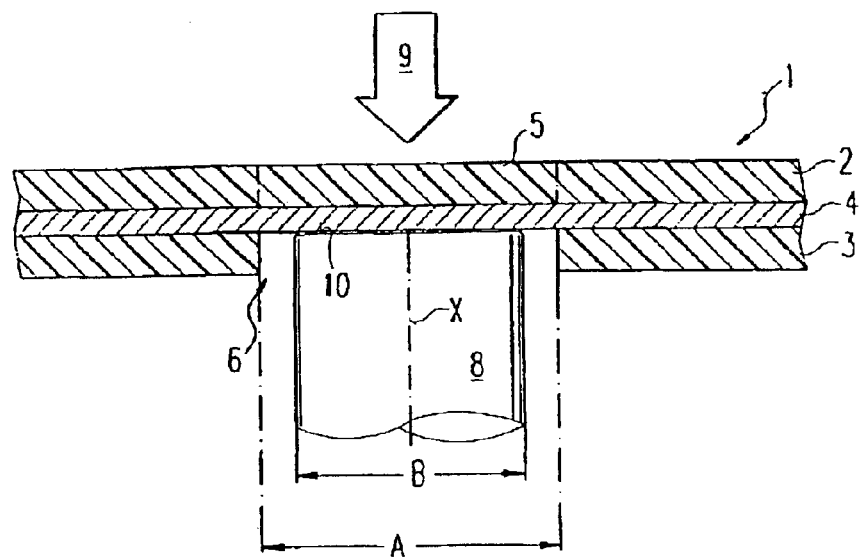
FIG. 1 shows a schematic sectional representation of a flexible circuit board and a metallic contact partner at a point in time directly before the creation of the welded connection according to the invention.

According to FIG. 1, a flexible circuit board 1 comprises a first insulating layer 3 and a second insulating layer 2, between which a conductor strip 4 is embedded.

The conductor strip 4 may consist, for example, of Cu; the insulating layers 2, 3 may comprise films of plastic commonly used in circuit board fabrication, such as polyimide films for example, and have a thickness of about 25 or else 50 μm. Depending on the type of circuit board 1, there may be an acrylic or epoxy resin adhesive between the conductor strip 4 and the insulating layers 2, 3 in a way not represented.

In the first insulating layer 3, an access opening 6 is formed. The corresponding region 5 in the second insulating layer 2, lying opposite the access opening 6, is intact, i.e. the conductor strip 4 is completely covered by the second insulating layer 2 in the region of the contact point to be fabricated on the side facing away from the access opening 6.

Flexible circuit boards of this type, which are provided with access openings exclusively on one side, are referred to in the art to as circuit boards with single-sided access. As already mentioned, they can be produced at much lower cost than circuit boards with access from both sides (i.e. circuit boards on which there are access openings in both insulating layers 2 and 3), because the attachment of the individual layers 2 (base material), 4 (metal foil) and 3 (outer film) and structuring steps for forming conductor strips 4 from the metal foil can be carried out on continuous webs of material (known as a reel-to-reel process). The access openings 6 in the outer film 4 may in this case either be prefabricated in the outer film (corresponds to the first insulating layer 3) already before the films/foils 2, 3, 4 are joined together or else they may be made subsequently in the outer film (first insulating layer 3), after the creation of the circuit board assembly, by depositing outer film material.

Underneath the conductor strip 4 there is a metallic, for example cylindrical, contact partner 8, which is to be welded to the conductor strip 4. The contact partner 8 may consist of a Cu alloy, for example CuSn 4/5/6.

Before carrying out the welding step, the flexible circuit board 1 and the contact partner 8 are brought toward each other in such a way that an end face 10 of the contact partner 8 bears fully against the conductor strip 4. The center longitudinal axis X of the contact partner 8 runs in the direction normal to the plane of the conductor strip. Preparatory working of the conductor strip 4 (for example a forming operation or perforation of the same) is not needed; the conductor strip 4 remains substantially planar, as represented in FIG. 1.

Figure 2:
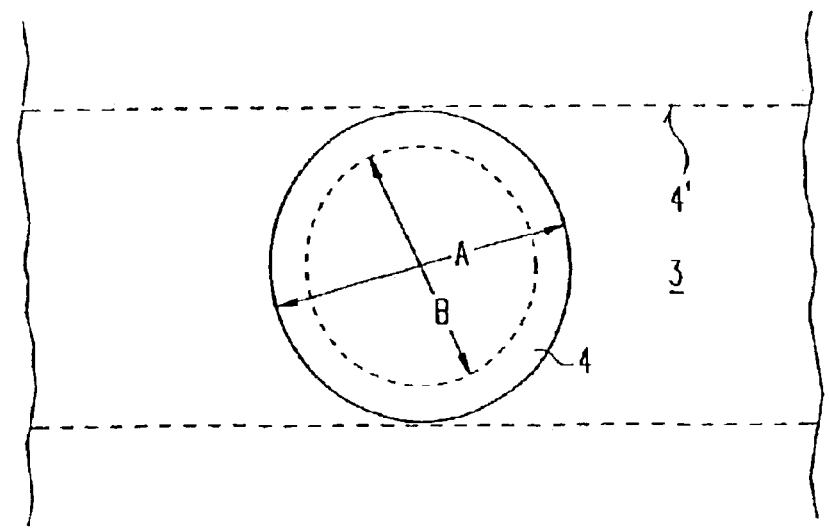
FIG. 2 shows a detail of the flexible circuit board shown in FIG. 1 in plan view of the first insulating layer, having the access opening.

FIG. 2 shows in plan view the contour line 4' of the conductor strip 4 and illustrates that the diameter B of the end face 10 of the contact partner 8 is smaller than the opening diameter A of the access opening 6 (for example 3 mm).

In a next step, laser light 9 is radiated by means of a laser onto the region 5 of the second insulating layer 2 covering the rear side of the conductor strip 4. Light incidence perpendicular to the plane of the conductor strip, with an optical axis which coincides with the center longitudinal axis X, is preferably chosen. When using an Nd:YAG laser, with a wavelength of 1.06 μm and an average power of 30–500 W, the following parameters have proven to be suitable for welding through a polyimide material (second insulating layer 2):
welding energy: 7–11 J
pulse power: 1–3 kW
welding time: 3–10 ms
diameter of the light spot generated by the laser on the second insulating layer 2: 0.3–0.6 mm With parameter values lying in these ranges, it was possible to couple an adequate amount of energy into the system for creating the welded connection and to optimize the deep-weld effect to the greatest extent, obtaining a melting depth of the surface of the contact partner of about 0.5–1 mm. As a result, it was possible to produce welded connections with good mechanical strength and low electrical transition resistance.

It was found in the course of the tests carried out that the quality of the weld can also be influenced by the influencing variables of angle of impingement of the laser beam, focus position and degree of oxidation of the Cu conductor strip 4. Further influencing variables are the diameter B of the contact partner 8 and—when using a contact partner 8 that is silvered on the end face—the thickness of this layer of silver (not represented).

It is pointed out that the parameters and influencing variables referred to at least partially influence one another, i.e. have to be optimized dependently on one another with respect to minimizing the deep-weld effect.

As already mentioned, given an ideal choice of the parameters, welded joints with a full-area, substantially circular disk-shaped connecting zone are created. In this case, thermal damage to the second insulating layer 2 takes place in the covering region 5 on the rear side of the welded joint, the loss of material that occurs there not occurring as a result of absorption processes in the laser irradiation but as a result of the thermal heating up of the conductor strip 4 and the resultant evaporation of material of the insulating layer.

A further improvement in the strength of the weld structure obtained can be achieved by the use of double laser light pulses, which are directed at different points of the outer film 3 lying within the contour of the access opening 6 lying opposite.

An important technical application of the arrangement according to the invention comprising the circuit board 4 and contact partner 8 with an electrical connecting point concerns the contacting of wiring elements (for example leadframes) or electrical components which are accommodated with an electronic control device in an engine or gearbox of a motor vehicle.

Figure 3:
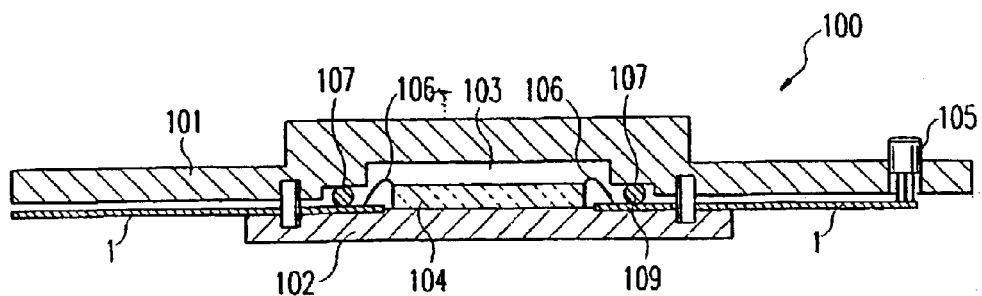
FIG. 3 shows a schematic sectional representation of an arrangement comprising a gearbox control device, flexible circuit board and electrical component contacted directly to the circuit board.

FIG. 3 shows in an exemplary way a gearbox control device 100. The gearbox control device 100 comprises a housing cover 101 and a metallic bottom plate 102. The housing cover 101 and the bottom plate 102 enclose a cavity 103. In the cavity 103 there is a circuit carrier 104, on which an electric circuit is realized. The circuit carrier 104 may be provided in the form of a ceramic substrate which is adhesively attached by a thermally conductive adhesive to the metallic bottom plate 102 serving as a heat sink.

The circuit carrier 104 is surrounded on all sides by a flexible circuit board 1, which is produced and configured in a way corresponding to the previous description. The conductor strips 4 (not represented) of the flexible circuit board 1 are connected by means of bonding wires 106 or else by means of direct electrical contact adhesions to corresponding contact pads on the circuit carrier 104. Details of the construction with regard to the connection between the electronic circuit and the flexible circuit board and the housing lead-through are described in WO 98/44593 and are incorporated in the present document by reference.

The housing cover 101 has a peripheral sealing surface 107 of a stepped form or formed as a groove, against which there bears an annular seal 109. The flexible circuit board 1 is led out between the annular seal 109 and the metallic bottom plate 102 from the cavity 103 of the control device housing 101, 102.

The housing cover 101 is configured as a carrier of the control device 100 and, in addition, forms a mounting plate for electronic components arranged outside the cavity 103. A temperature sensor 105, which is fastened in a mounting opening of the housing cover 101, is represented in FIG. 3 as an example of an electronic component.

The flexible circuit board 1 is led on the underside of the housing cover 101 to the temperature sensor 105, where terminal pins 108 of the temperature sensor 105 are contacted by means of welded joints produced in the way according to the invention. The terminal pins 108 constitute the contact partners 8.

Figure 4A:
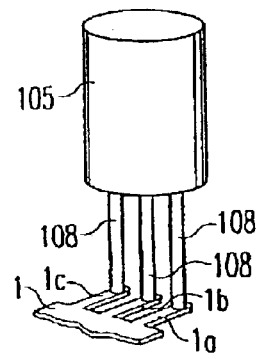
FIGS. 4a, 4b show perspective views of the connection shown in FIG. 3 between the flexible circuit board and the electrical component from laterally above and laterally below the circuit board.
Figure 4B:
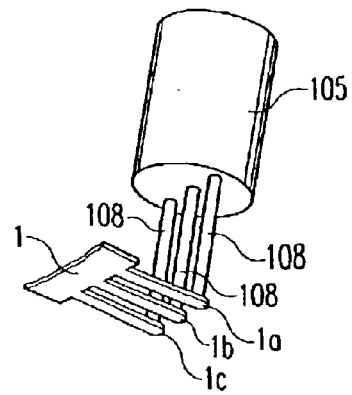

FIGS. 4*a* and 4*b* show in perspective views the connection between the flexible circuit board 1 and the terminal pins 108. It becomes clear that the flexible circuit board 1 with peripheral protruding fingers 1*a*, 1*b*, 1*c* may be configured for contacting the terminal pins 108.

To sum up, it can be stated that, by the use of a low-cost circuit board 1 with single-sided access and the use of a low-cost direct mounting process by laser welding, significant cost savings are made possible in the case of the application example shown in FIGS. 3, 4*a* and 4*b*—in particular in the case of mass production.

As an alternative to the direct contacting of components 105 shown in FIG. 3, FIG. 4*a* and FIG. 4*b*, the circuit board 1 may also be connected in an analogous way to the ends of electrical wiring elements, for example leadframes, running in the gearbox or in the engine.

What is claimed is:

1. A method for producing an electrical connection between a flexible circuit board with single-sided access and a metallic contact partner, comprising the steps of:

providing the flexible circuit board, comprising two insulating layers and at least one metallic conductor strip running in between, wherein in the first insulating layer of which there is formed an access opening exposing the conductor strip;

bringing the metallic contact partner and the circuit board toward each other in such a way that the metallic contact partner is brought to bear against the metallic conductor strip through the access opening; and irradiating the second insulating layer with laser light at a location lying opposite the access opening, wherein a welded connection being formed between the contact partner and the conductor strip.

2. The method as claimed in claim 1, wherein the irradiation is carried out without instantaneously melting the contact partner.

3. The method as claimed in claim 1, wherein the welding operation is carried out in such a way that a melting depth of the surface of the contact partner of between 0.5 and 1 mm is obtained by the laser light irradiation.

4. The method as claimed in claim 1, wherein an Nd:YAG laser is used as the laser light source and is operated at an average power in the range from 30 to 500 W.

5. The method as claimed in claim 1, wherein a light spot with a diameter of between 0.3 and 0.6 mm is produced on the second insulating layer by means of an optical system lying in the beam of the laser.

6. The method as claimed in claim 1, wherein a welding energy of from 7 to 11 J is applied during a welding period of from 3 to 10 ms.

7. The method as claimed in claim 1, wherein a pulsed Nd:YAG laser with a pulse power of 1 to 3 kW is used.

8. The method as claimed in claim 1, wherein a number of laser light pulses applied to the second insulating layer in a positionally offset manner are used for creating the welded connection.

9. The method as claimed in claim 1, wherein the contact partner has a silvered bearing surface.

* * * * *